(12) United States Patent
Hong et al.

(10) Patent No.: US 11,835,566 B2
(45) Date of Patent: Dec. 5, 2023

(54) ELECTRONIC DEVICE FOR MEASURING BEAMFORMING SIGNAL HAVING PLURALITY OF DIRECTIONS, AND METHOD OF OPERATING SAME

(71) Applicant: Samsung Electronics Co., Ltd., Gyeonggi-do (KR)

(72) Inventors: Ilpyo Hong, Gyeonggi-do (KR); Jihee Kang, Gyeonggi-do (KR); Jiyong Kim, Gyeonggi-do (KR); Jihoon Kim, Gyeonggi-do (KR); Jongin Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 314 days.

(21) Appl. No.: 17/294,756

(22) PCT Filed: Nov. 19, 2019

(86) PCT No.: PCT/KR2019/015893
§ 371 (c)(1),
(2) Date: May 18, 2021

(87) PCT Pub. No.: WO2020/106041
PCT Pub. Date: May 28, 2020

(65) Prior Publication Data
US 2022/0018884 A1    Jan. 20, 2022

(30) Foreign Application Priority Data
Nov. 19, 2018    (KR) .................. 10-2018-0142571

(51) Int. Cl.
| | |
|---|---|
| *G01R 31/26* | (2020.01) |
| *G01R 29/10* | (2006.01) |
| *H04B 17/10* | (2015.01) |
| *H04B 17/15* | (2015.01) |
| *H04B 17/29* | (2015.01) |
| *G01R 31/28* | (2006.01) |
| *H04B 7/06* | (2006.01) |

(52) U.S. Cl.
CPC ....... *G01R 29/105* (2013.01); *G01R 31/2822* (2013.01); *H04B 7/0617* (2013.01);
(Continued)

(58) Field of Classification Search
CPC ............ G01R 29/0871; G01R 29/0878; G01R 29/0892; G01R 29/10; G01R 29/105;
(Continued)

(56) References Cited

U.S. PATENT DOCUMENTS

| | | | |
|---|---|---|---|
| 7,203,489 B2 | 4/2007 | Saunders | |
| 8,331,869 B2 * | 12/2012 | Foegelle | H04B 17/0082 455/115.2 |

(Continued)

FOREIGN PATENT DOCUMENTS

| | | |
|---|---|---|
| JP | 5168940 B2 | 3/2013 |
| KR | 10-2013-0005171 A | 1/2013 |

(Continued)

OTHER PUBLICATIONS

Korean Office Action dated Jul. 17, 2023.

*Primary Examiner* — Thang X Le
(74) *Attorney, Agent, or Firm* — Cha & Reiter, LLC

(57) ABSTRACT

An electronic device, according to one embodiment disclosed in the present disclosure, may be configured to: form a beam in any one direction of a first direction and directions rotated by a first angle on the basis of the first direction; control a device under test (DUT) so as to emit a designated signal by using the formed beam; and check antenna performance of the DUT at least on the basis of intensity measured from a signal measuring device. In addition, various embodiments inferred from the specification are also possible.

15 Claims, 8 Drawing Sheets

(52) U.S. Cl.
CPC ........... *H04B 17/102* (2015.01); *H04B 17/15* (2015.01); *H04B 17/29* (2015.01)

(58) Field of Classification Search
CPC .... G01R 31/2822; H04B 17/13; H04B 17/15; H04B 17/17; H04B 17/29; H04B 17/102; H04B 7/0617; H04B 7/0695; H04B 7/0426
See application file for complete search history.

(56) References Cited

U.S. PATENT DOCUMENTS

| | | | |
|---|---|---|---|
| 8,805,290 B2 * | 8/2014 | Guo | H04B 17/0087 455/67.11 |
| 9,024,828 B2 * | 5/2015 | Reed | G01R 29/10 343/703 |
| 10,145,878 B2 | 12/2018 | Brunel et al. | |
| 10,236,966 B2 | 3/2019 | Brunel et al. | |
| 10,389,421 B2 | 8/2019 | Lee et al. | |
| 2004/0116111 A1 | 6/2004 | Saunders | |
| 2009/0153158 A1 | 6/2009 | Dunn et al. | |
| 2017/0117946 A1 | 4/2017 | Lee et al. | |
| 2018/0224490 A1 | 8/2018 | Brunel et al. | |
| 2018/0227034 A1 | 8/2018 | Brunel et al. | |
| 2019/0178927 A1 | 6/2019 | Brunel et al. | |
| 2019/0393968 A1 * | 12/2019 | Ioffe | H01Q 3/267 |
| 2020/0119443 A1 * | 4/2020 | Leather | H04B 10/073 |
| 2020/0395986 A1 * | 12/2020 | Ligander | H04B 17/27 |

FOREIGN PATENT DOCUMENTS

| | | |
|---|---|---|
| WO | 02/073997 A1 | 9/2002 |
| WO | 2020/013549 A1 | 1/2020 |

* cited by examiner

ELECTRONIC DEVICE FOR MEASURING BEAMFORMING SIGNAL HAVING PLURALITY OF DIRECTIONS, AND METHOD OF OPERATING SAME

CROSS REFERENCE TO RELATED APPLICATIONS

This application is a National Phase Entry of PCT International Application No. PCT/KR2019/015893, which was filed on Nov. 19, 2019, and claims a priority to Korean Patent Application No. 10-2018-0142571, which was filed on Nov. 19, 2018, the contents of which are incorporated herein by reference.

TECHNICAL FIELD

Embodiments disclosed in the present disclosure relate to an electronic device for measuring a beamforming signal having a plurality of directions, and a method of operating the same.

BACKGROUND ART

With the development of information technology (IT), various types of electronic devices such as a smartphone and a tablet personal computer (PC) have been widely spread. The electronic devices may wirelessly communicate with other electronic devices or base stations using an antenna.

With the recent rapid increase in network traffic by mobile devices, 5-th generation (5G) mobile communication technology using signals in an ultra-high frequency band has been developed. As a signal in an ultra-high frequency band is used, the wavelength of the signal may be shortened in millimeters, and a wider bandwidth may be used, thereby making it possible to transmit or receive a larger amount of information.

Since the signal in the ultra-high frequency band as described above has strong linearity, in order to communicate with electronic devices or base stations, which may be positioned in various directions, an antenna technology capable of changing the direction of a beam for transmitting or receiving the signal, for example, a beamforming technology may be required. In the beamforming technology, it may be important that an electronic device forms a beam to be accurately directed in a specific direction and maintains the antenna performance in the specific direction at a specified level or higher.

In addition, the signal may have a vertical polarization characteristic or horizontal polarization characteristic. In this case, it may be important for the electronic device to emit a signal having a specified polarization characteristic with an intensity equal to or higher than a specified level.

DISCLOSURE OF THE INVENTION

Technical Problem

As described above, an antenna chamber may be used to measure the antenna performance of the electronic device, for example, the beamforming performance. The antenna chamber is a small room surrounded by walls having anti-reflection characteristics, and may include an antenna for measuring a signal emitted from a device under test (DUT) disposed therein.

Various methods may be used in measuring the beamforming or polarization performance of the device under test. However, if antennas are arranged to correspond to the directions of all beams that are formable by the device under test, there may be a problem in that cost increases and space efficiency decreases. In addition, if the device under test is rotated, an error due to rotation may additionally occur, and there may be a problem that the device under test may be damaged.

Embodiments disclosed in the present disclosure are to provide an electronic device for solving the aforementioned problems and the problems posed in the present disclosure.

Technical Solution

An aspect of the present disclosure provides an antenna chamber including a signal generator, a mounting unit on which a device under test (DUT) is disposed, the DUT being electrically connected to the signal generator to form a beam toward a first direction and directions rotated by a first angle based on the first direction, a plurality of antennas disposed at a position corresponding to the first direction from the DUT and positions corresponding to directions rotated by twice the first angle from the DUT based on the first direction and receiving a signal emitted from the DUT, a signal meter configured to measure an intensity of a signal received from at least one of the plurality of antennas, and a control circuit electrically connected to the DUT, the signal generator, and the signal meter, in which the control circuit is configured to control the signal generator to generate a specified signal and transmit the specified signal to the DUT, control the DUT to form a beam in any one direction of the first direction and the directions rotated by the first angle based on the first direction and emit the specified signal by using the formed beam, and check an antenna performance of the DUT based on at least the intensity measured from the signal meter.

Another aspect of the present disclosure provides a method of checking an antenna performance of a DUT capable of forming a beam toward a first direction and directions rotated by a first angle based on the first direction, the method including generating a specified signal to transmit the specified signal to the DUT, controlling the DUT to form a beam in any one direction of the first direction and the directions rotated by the first angle based on the first direction and emit the specified signal by using the formed beam, receiving a signal emitted from the DUT through a plurality of antennas disposed at a position corresponding to the first direction from the DUT and positions corresponding to directions rotated by twice the first angle from the DUT based on the first direction, measuring an intensity of the received signal, and checking an antenna performance of the DUT based on at least the measured intensity.

Another aspect of the present disclosure provides an antenna module including a signal generator configured to generate a specified signal, a control circuit configured to control an external antenna module capable of forming a beam in a first direction, a second direction that forms a first angle with respect to the first direction, or a third direction that forms the first angle with respect to the second direction and is different from the first direction on a plane including the first direction and the second direction such that the external antenna module forms the beam and emits the specified signal, a first antenna disposed between the first direction and the second direction and capable of measuring vertical polarization and horizontal polarization, a second antenna disposed between the second direction and the third direction and capable of measuring the vertical polarization and the horizontal polarization, and a signal meter configured to measure a magnitude of the specified signal received through the first antenna and the second antenna.

Advantageous Effects

According to the embodiments disclosed in the present disclosure, it is possible to accurately measure the beamforming performance of a device under test by using fewer antennas. In addition, it is possible to minimize external damage to the device under test and distortion of the antenna performance, during a performance test. Besides, various effects may be provided that are directly or indirectly identified through the present disclosure.

BRIEF DESCRIPTION OF THE DRAWINGS

With respect to the description of the drawings, the same or similar reference signs may be used for the same or similar elements.

MODE FOR CARRYING OUT THE INVENTION

Figure 1:
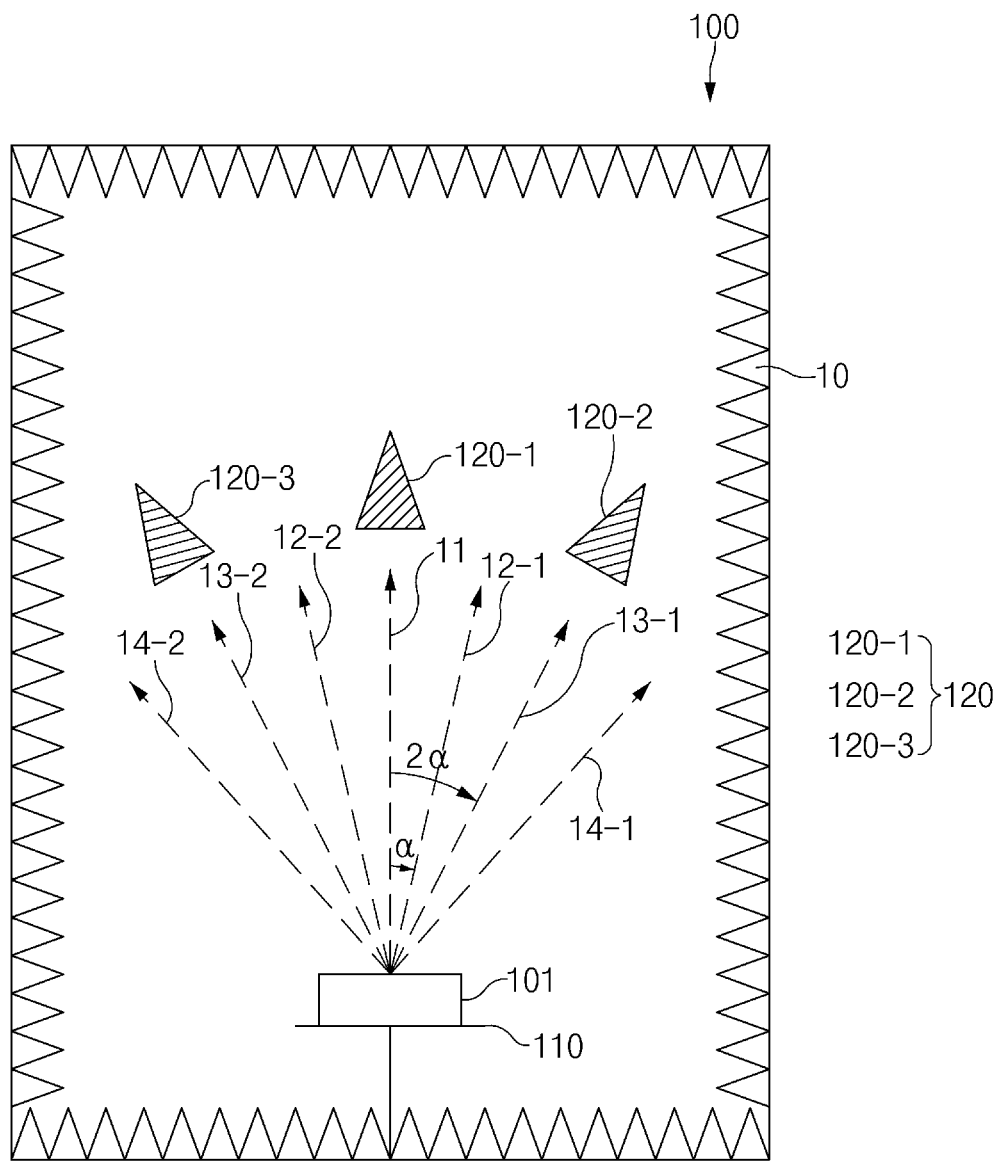
FIG. 1 is a diagram illustrating an antenna chamber according to an embodiment.

FIG. 1 is a diagram illustrating an antenna chamber 100 according to an embodiment.

Referring to FIG. 1, the antenna chamber 100 may include a mounting unit 110 on which a device under test (DUT) 101 is mounted and a plurality of antennas 120. According to various embodiments, the antenna chamber 100 may additionally include a configuration not illustrated in FIG. 1, or some of components illustrated in FIG. 1 may be omitted. For example, the antenna chamber 100 may further include a signal meter (e.g., a signal meter 140) electrically connected to the plurality of antennas 120.

According to an embodiment, the antenna chamber 100 may be surrounded by wall surfaces 10 having anti-reflection characteristics. In this way, an electromagnetic signal emitted from the DUT 101, for example, a millimeter-wave signal, may not be reflected when it reaches the wall surfaces 10 of the antenna chamber 100. For example, the millimeter-wave signal may be absorbed by the wall surfaces when it reaches the wall surfaces 10 of the antenna chamber 100.

According to an embodiment, the DUT 101 disposed on the mounting unit 110 may be configured to emit a millimeter-wave signal in a specified direction. For example, the DUT 101 may emit a millimeter-wave signal in the specified direction using a beamforming technique that forms a beam in a specified direction. For example, the DUT 101 may include an antenna module (e.g., an antenna module 797) constituted by a plurality of emitters. Each of the plurality of emitters may emit a specified signal, and a phase of a signal emitted from each emitter may be changed by a phase shifter (PS) electrically connected to each of the emitters. A phase difference may occur between signals emitted from respective emitters, and the antenna module may form a beam in a specified direction based on the phase difference.

According to an embodiment, the direction in which the DUT 101 is capable of forming a beam may be changed by a specified angle in a unit angle, for example, a first angle $\alpha$ as a unit angle. For example, the DUT 101 may form a beam toward any direction, for example, a first direction 11, and may form a beam toward a second direction 12-1 rotated by the first angle with respect to the first direction 11. In an embodiment, the first angle may be understood as a minimum value of an angle between two adjacent directions among directions of beams that the DUT 101 is capable of forming or angles between a plurality of directions in which the DUT 101 is capable of forming beams. In an embodiment, the first angle may be determined based on a characteristic of the PS included in the DUT 101.

According to an embodiment, the plurality of antennas 120 may include, for example, a first antenna 120-1, a second antenna 120-2, and a third antenna 120-3. According to various embodiments, the plurality of antennas 120 are not limited to those illustrated in FIG. 1. For example, the plurality of antennas 120 may further include a fourth antenna, or at least one of the antennas illustrated in FIG. 1 may be omitted.

According to an embodiment, the plurality of antennas 120 may be disposed at positions corresponding to directions specified from the DUT 101. For example, the plurality of antennas 120 may be disposed at positions spaced apart from the DUT 101 by a specified distance and each corresponding to any one of the directions of the beams formed by the DUT 101. According to an embodiment, the first antenna 120-1 may be disposed at a position corresponding to the first direction 11 and spaced apart by a specified distance, from the DUT 101.

According to an embodiment, the plurality of antennas 120 may be disposed at positions corresponding to the directions rotated by a specified angle as a unit, for example, a second angle $2\alpha$, with respect to the first direction 11 from the DUT 101. For example, the second antenna 120-2 may be disposed at a position spaced apart from the DUT 101 by a specified distance and corresponding to the direction rotated clockwise from the first direction 11 by a second angle, for example, a third-first direction 13-1, as illustrated in FIG. 1. For another example, the third antenna 120-3 may be disposed at a position spaced apart from the DUT 101 by a specified distance and corresponding to the direction rotated counterclockwise from the first direction 11 by a second angle, for example, a third-second direction 13-2, as illustrated in FIG. 1.

According to various embodiments, the second angle is not limited to that illustrated in FIG. 1. For example, in FIG. 1, the second angle is illustrated to be twice the first angle, but the second angle may be three times or four times the first angle.

In an embodiment, if the DUT 101 accurately directs and emits the millimeter-wave signal in the set direction, the intensity of the millimeter-wave signal detected by the plurality of antennas 120 may be equal to or higher than a specified level. In this case, a determination may be made that the beamforming performance of the DUT 101 is equal to or higher than a specified level. In another embodiment, if the DUT 101 emits the millimeter-wave signal in a direction different from the set direction, the intensity of the millimeter-wave signal detected by the plurality of antennas 120 may be lower than the specified level. In this case, a determination may be made that the beamforming performance of the DUT 101 is less than the specified level.

According to various embodiments, the specified level may be different depending on the emitting direction of the DUT 101. For example, if the DUT 101 forms a beam and emits the specified signal toward the directions in which the antennas are disposed, for example, the first direction 11, the third-first direction 13-1, or the third-second direction 13-2, the specified level may be relatively high. For another example, if the DUT 101 forms a beam and emits the specified signal toward the directions in which the antennas 120 are not disposed, for example, a second-first direction 12-1, a second-second direction 12-2, a fourth-first direction, or a fourth-second direction, the specified level may be relatively low. For example, the specified level may be approximately 3 dB lower when the signal is emitted in a direction in which the antenna 120 is not disposed than when the signal is emitted in a direction in which the antenna 120 is disposed.

In the present specification, the millimeter-wave signal may be understood as an electromagnetic wave of which the wavelength is in units of millimeters. The frequency of the millimeter-wave signal may be, for example, equal to or greater than 20 GHz and lower than or equal to 100 GHz, and may have strong straightness. In addition, in the present specification, the DUT 101 may be understood as an electronic device (e.g., an electronic device 601 of FIG. 6) that performs communication by using the millimeter-wave signal.

In the present specification, the contents described in FIG. 1 may be equally applied to the components having the same reference numerals as those of the antenna chamber 100 illustrated in FIG. 1.

Figure 2:
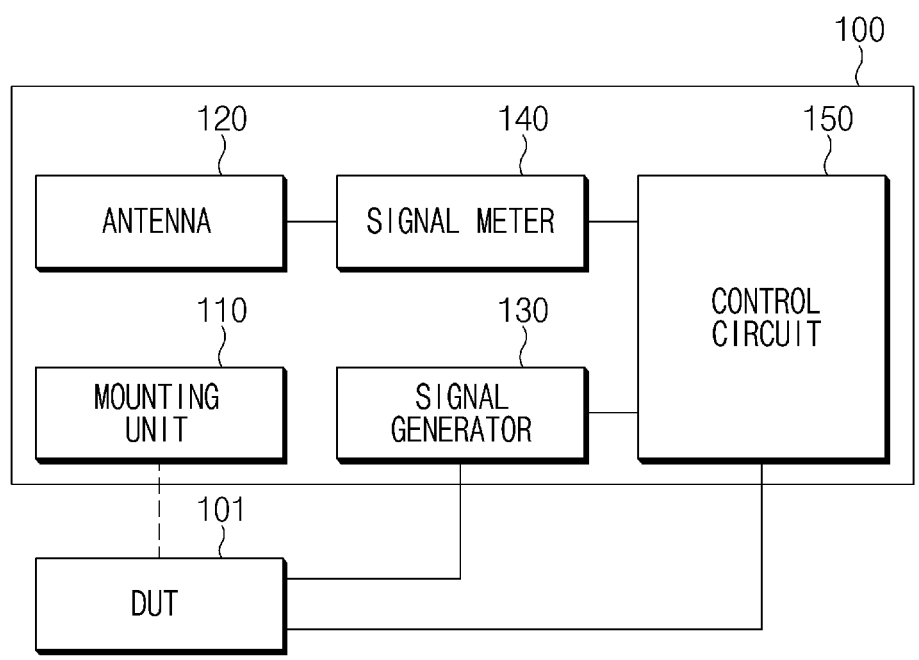
FIG. 2 is a block diagram illustrating an antenna chamber according to an embodiment.

FIG. 2 is a block diagram illustrating an antenna chamber according to an embodiment.

Referring to FIG. 2, the antenna chamber 100 includes the mounting unit 110 on which the DUT 101 is mounted, the antenna 120, the signal generator 130, the signal meter 140, and the control circuit 150. In FIG. 2, it may be understood that the connection between the mounting unit 110 and the DUT 101 is indicated by a dotted line indicates a physical contact, not an electrical connection. According to various embodiments, the antenna chamber 100 may additionally include a component not illustrated in FIG. 2, or some of the components illustrated in FIG. 2 may be omitted. For example, the antenna chamber 100 may further include at least one switch (e.g., a first switch 310 and/or a second switch 320). In the description of FIG. 2, content that has been already shown in the description of FIG. 1 may be omitted.

According to an embodiment, the mounting unit 110 may be a region in which the DUT 101 that emits a specified signal, for example, a millimeter-wave signal, is disposed. According to an embodiment, the mounting unit 110 may include a device for fixing the DUT 101 so as not to move.

According to various embodiments, the DUT 101 may be an antenna module (e.g., the antenna module 797) or an electronic device (e.g., an electronic device 700) including the antenna module (e.g., the antenna module 797). According to an embodiment, the antenna module (e.g., the antenna module 797) may include at least one antenna array. For example, the antenna module (e.g., the antenna module 797) may include a patch antenna array including a plurality of patch antenna elements. For another example, the antenna module (e.g., the antenna module 797) may include a dipole antenna array including a plurality of dipole antenna elements. According to an embodiment, the antenna module (e.g., the antenna module 797) may include a communication circuit, for example, a radio frequency integrated circuit (RF IC). The antenna module (e.g., the antenna module 797) may amplify a signal or form a beam toward a specified direction by using a power amplifier (PA), a phase shifter (PS), a low noise amplifier (LNA), or the like, included in the RF IC.

In an embodiment, if the DUT 101 is an antenna module (e.g., the antenna module 797), the DUT 101 does not include its own power supply, and thus may receive power from the outside. In addition, in this case, since the DUT 101 may not generate a signal or change the direction of the beam by itself, the DUT 101 may form a beam in a specified direction based on the signal transmitted from the signal generator 130 or control of the control circuit 150 and emit a specified signal. In another embodiment, if the DUT 101 is an electronic device including an antenna module (e.g., the antenna module 797), the DUT 101 may generate a signal by itself or change the direction of a beam. However, even in this case, the DUT 101 may form a beam in the specified direction based on the signal transmitted from the signal generator 130 or control of the control circuit 150 and emit the specified signal.

According to an embodiment, there may be a plurality of antennas 120. In an embodiment, the antenna 120 may be disposed to face the mounting unit 110. The antenna 120 may detect and receive a specified signal emitted from the DUT 101, for example, a millimeter-wave signal. In an embodiment, the antenna 120 may detect a signal deflected from the DUT 101 in a specified direction. For example, the antenna 120 may detect a horizontally deflected signal or a vertically deflected signal. According to an embodiment, the antenna 120 may be a horn antenna or a circular horn antenna. In an embodiment, if the antenna 120 is the circular horn antenna, both a horizontally polarized signal and a vertically polarized signal may be detected even if the antenna 120 is not rotated.

According to an embodiment, the signal generator 130 may generate a specified signal, e.g., a millimeter-wave signal, and transmit the generated signal to the DUT 101. According to an embodiment, the specified signal may have a specified intensity and may be deflected in a specified direction. For example, the specified signal may be a horizontally polarized signal or a vertically polarized signal.

According to an embodiment, the signal meter 140 may measure the intensity of a signal received from the antenna 120 and transmit the measured result to the control circuit 150. According to various embodiments, the signal meter 140 may measure a signal received from each of the plurality of antennas 120 and transmit the measured results to the control circuit 150. For example, referring to FIG. 1, if the DUT 101 emits a specified signal toward the second-first direction 12-1, the first antenna 120-1 and the second antenna 120-2 may each receive the specified signal. The signal meter 140 may measure the intensity of the signal received from each of the antennas 120 and transmit it to the control circuit 150.

According to an embodiment, the control circuit 150 may be electrically connected to the DUT 101, the signal generator 130, or the signal meter 140. In various embodiments, the control circuit 150 may control the electrically connected components, perform an operation on electrical signals received from the components, or transmit results of the performed operation to the components. For example, the control circuit 150 may control the signal generator 130 such that a specific signal is transmitted to the DUT 101. For another example, the control circuit 150 may control the DUT 101, for example, the RF IC included in the DUT 101 such that the DUT 101 forms a beam in a specified direction.

According to an embodiment, the control circuit 150 may perform a specified operation based on the result of the performed operation. For example, the control circuit 150 may check the antenna performance of the DUT 101 based on at least the intensity measured by the signal meter 140.

According to an embodiment, the antenna chamber 100 may further include a display (not illustrated) for displaying information related to the antenna performance of the DUT 101.

In the present specification, the contents described in FIG. 2 may be equally applied to the components having the same reference numerals as those of the antenna chamber 100 illustrated in FIG. 2.

Figure 3:
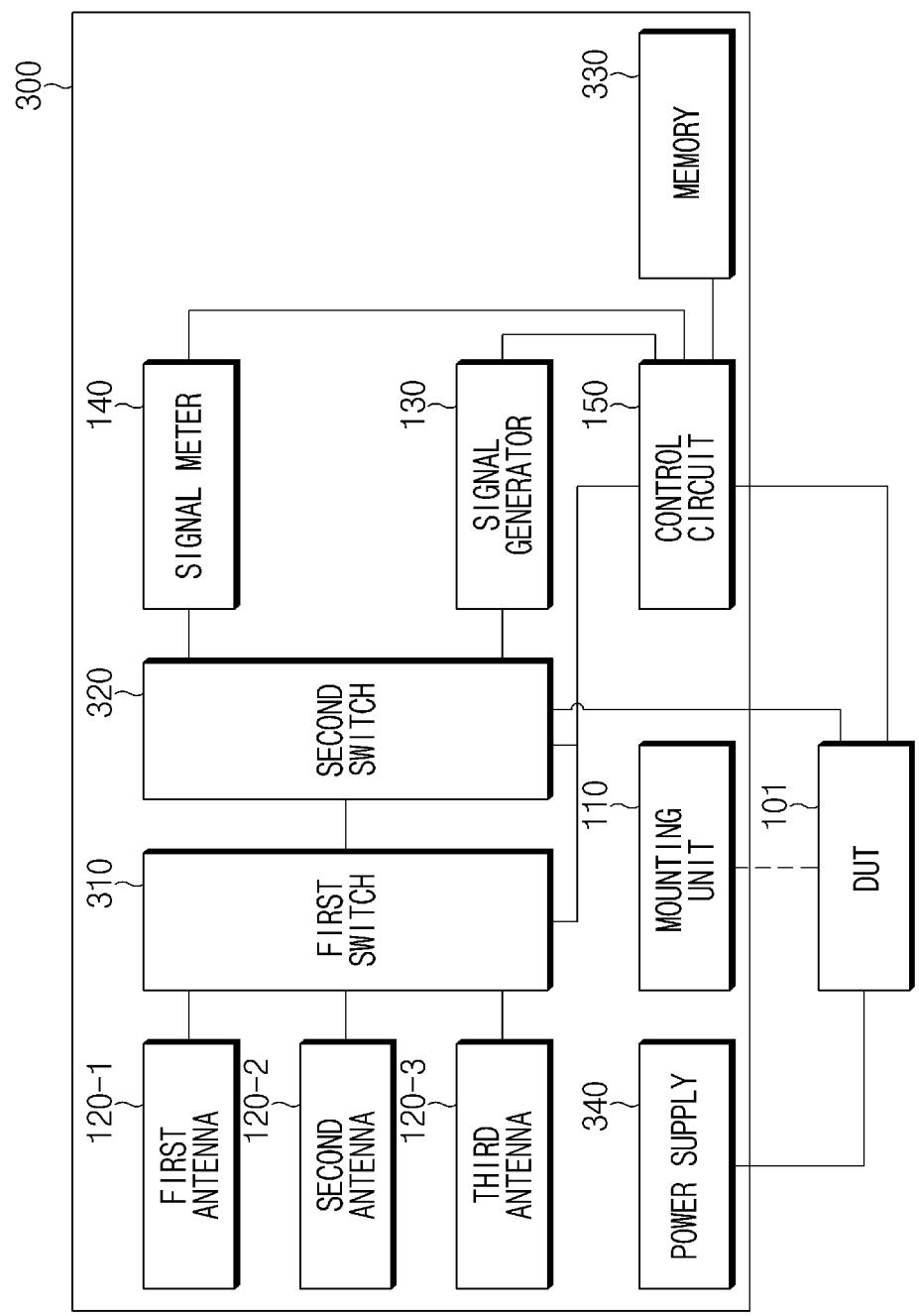
FIG. 3 is a block diagram illustrating an antenna chamber according to another embodiment.

FIG. 3 is a block diagram illustrating an antenna chamber according to another embodiment.

Referring to FIG. 3, an antenna chamber 300 (e.g., the antenna chamber 100) may include the mounting unit 110 on which the DUT 101 is mounted, the first antenna 120-1, the second antenna 120-2, and the third antenna 120-3, the signal generator 130, the signal meter 140, the control circuit 150, the first switch 310, the second switch 320, a memory 330, and a power supply 340. According to various embodiments, the configuration of the antenna chamber 300 is not limited to that illustrated in FIG. 3. For example, the antenna chamber 300 may further include an antenna not illustrated in FIG. 3, or at least one of the antennas illustrated in FIG. 3 may be omitted. For another example, the power supply 340 may be omitted depending on the type of DUT 101. According to various embodiments, in the description of FIG. 3, content that has been already shown in the description of FIG. 2 may be omitted.

According to an embodiment, the first switch 310 may be a single-pole n-through (SPnT) type switch. In an embodiment, the first switch 310 may electrically connect the n antennas to the second switch 320. For example, the first switch 310 may electrically connect at least one of the first antenna 120-1, the second antenna 120-2, and the third antenna 120-3 to the second switch 320, based on the direction of a signal emitted by the DUT 101, for example, the direction of a beam formed by the DUT 101. In an embodiment, the operation of the first switch 310 may be controlled by the control circuit 150.

For example, referring to FIG. 1, if the DUT 101 forms a beam toward the first direction 11 and emits the specified signal, the first antenna 120-1 is disposed at a position corresponding to the first direction 11, and thus the first switch 310 may electrically connect the first antenna 120-1 to the second switch 320. For another example, referring to FIG. 1, if the DUT 101 forms a beam toward the second-first direction 12-1 and emits the specified signal, the antenna may not be disposed at the position corresponding to the second-first direction 12-1. At least a portion of the specified signal may be received via the first antenna 120-1 and the second antenna 120-2. In this case, the first switch 310 may electrically connect the first antenna 120-1 and the second antenna 120-2 to the second switch 320.

According to an embodiment, the second switch 320 may be a double pole double through (DPDT) type switch. In an embodiment, the second switch 320 may electrically connect the first switch 310 or the DUT 101 to the signal meter 140 or the signal generator 130. For example, the second switch 320 may connect the signal generator 130 and the DUT 101 to each other to transmit a signal generated by the signal generator 130 to the DUT 101. For another example, the second switch 320 may connect the first switch 310 and the signal meter 140 to each other to transmit the signal received from the antenna to the signal meter 140. According to an embodiment, the connections may be made independently. For example, the connection between the signal generator 130 and the DUT 101 and the connection between the first switch 310 and the signal meter 140 may be made at the same time or at different times. In an embodiment, the operation of the second switch 320 may be controlled by the control circuit 150.

According to an embodiment, the power supply 340 may supply power for the operation of the DUT 101 when the DUT 101 does not include its own power supply 340, for example, when the DUT 101 is simply an antenna module (e.g., the antenna module 797).

According to an embodiment, the memory 330 may be electrically connected to the control circuit 150 and may store a plurality of instructions for operating the control circuit 150. According to an embodiment, the memory 330 may store information on a signal transmitted from the DUT 101, for example, the intensity or a deflected direction of the signal.

According to an embodiment, the control circuit 150 may be electrically connected to the signal generator 130, the signal meter 140, the DUT 101, the first switch 310, the second switch 320, and the memory 330. The control circuit 150 may perform a control or operation on the components electrically connected. For example, the control circuit 150 may control the signal generator 130 to generate the specified signal, and may store information on the specified signal in the memory 330. For another example, the control circuit 150 may check the antenna performance of the DUT 101 based on information stored in the memory 330 and a measurement result received from the signal meter 140. For another example, the control circuit 150 may control the operation of the first switch 310 and the second switch 320, for example, on/off of each of the switches 310 and 320.

Figure 4:
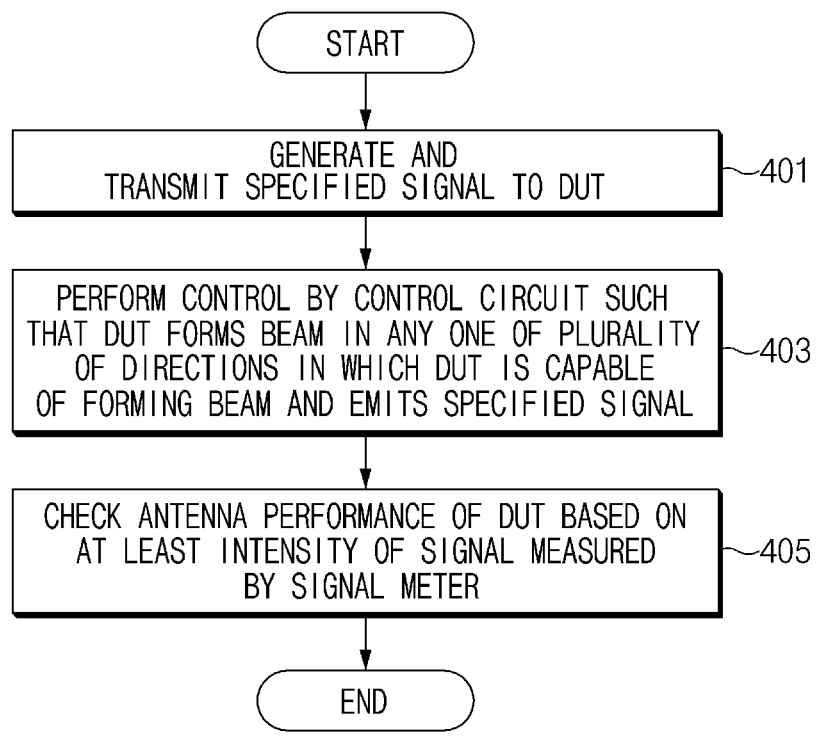
FIG. 4 is a flowchart illustrating a method of verifying an antenna performance of a device under test (DUT) by an antenna chamber according to an embodiment.

FIG. 4 is a flowchart illustrating a method of checking an antenna performance of a DUT by an antenna chamber according to an embodiment.

Referring to FIG. 4, a method of checking the antenna performance of the DUT by the antenna chamber may include operations 401 to 405. According to various embodiments, operations 401 to 405 may be understood as being performed by the antenna chamber 100 (or the control circuit 150) illustrated in FIG. 2 or the antenna chamber 300 (or the control circuit 150) illustrated in FIG. 3.

In operation 401, the control circuit 150 may control a signal generator (e.g., the signal generator 130 of FIG. 2) such that a specified signal is generated and transmitted to a DUT (e.g., the DUT 101 of FIG. 1). According to an embodiment, the specified signal may have a specified intensity and may have a specified polarization characteristic.

In operation 403, the control circuit 150 may control the DUT 101 to form a beam in any one of a plurality of directions in which the DUT 101 is capable of forming the beam and emit the specified signal by using the formed beam. For example, the control circuit 150 may control an RF IC included in the DUT 101 such that a patch antenna array or a dipole antenna array included in the DUT 101 forms a beam in a specified direction. For example, the control circuit 150 may control the PS included in the RF IC such that signals applied to each of the patch antenna elements included in the patch antenna array have a specified phase difference.

In operation 405, the control circuit 150 may check the antenna performance of the DUT 101 based on at least the intensity of the signal measured by a signal meter (e.g., the signal meter 140 of FIG. 2) via an antenna (e.g., the antenna 120 of FIG. 2). In an embodiment, the control circuit 150 may determine whether the intensity of the signal that has been emitted toward a specified direction and measured by the signal meter through the antenna corresponding to the specified direction is equal to or greater than a specified threshold value.

For example, if an antenna is disposed at a position corresponding to the specified direction, the control circuit 150 may determine whether the DUT 101 has formed a beam toward the specified direction based on whether the signal measured by the signal meter through the antenna is equal to or greater than a first threshold value. In an embodiment, if the measured intensity of the signal is equal to or greater than the first threshold value, the control circuit 150 may determine that the DUT 101 has formed a beam toward the specified direction.

For another example, if the antenna is not disposed at the position corresponding to the specified direction, a plurality of antennas may be disposed at positions corresponding to two directions adjacent to the specified direction.

According to an embodiment, the control circuit 150 may determine whether the DUT 101 has formed a beam toward the specified direction based on whether the signal measured by the signal meter through the plurality of antennas is equal to or greater than a second threshold value. In an embodiment, if the measured intensity of the signal is equal to or greater than the second threshold value, the control circuit 150 may determine that the DUT 101 has formed a beam toward the specified direction. In an embodiment, the second threshold value may be approximately 3 dB lower than the first threshold value.

According to another embodiment, the control circuit 150 may determine whether the DUT 101 has formed a beam toward the specified direction based on whether the intensity difference between signals measured through the plurality of antennas is less than or equal to a specified level. For example, referring to FIG. 1, the DUT 101 may emit a specified signal toward the second-first direction 12-1. In this case, if the difference between the intensity of the first signal received through the first antenna and the intensity of the second signal received through the second antenna is less than or equal to the specified level, the DUT 101 may determine that the specified signal is emitted toward a center direction of the first direction 11 and the third-first direction 13-1, for example, the second-first direction 12-1.

According to an embodiment, the antenna chamber 100 or 300 may repeatedly perform operations 401 to 405 in a plurality of directions. For example, the control circuit 150 may control the DUT 101 such that the DUT 101 forms a beam in the order of a specified direction, for example, in the clockwise order (or vice versa) from the fourth-second direction 14-2 to the fourth-first direction 14-1 illustrated in FIG. 1, at a specified time interval, and emits the specified signal. In this case, the control circuit 150 may determine whether the DUT 101 emits a signal having an intensity equal to or greater than a specified level toward each direction using the signal meter.

In an embodiment, if a signal having an intensity that is less than a specified level is measured in at least one of the plurality of directions, the control circuit 150 may determine that the beamforming performance of the DUT 101 is not normal or is less than a specified level. Through operations 401 to 405, the antenna chamber 100 or 300 may check the antenna performance of the DUT 101 even if fewer antennas are disposed.

Figure 5A:
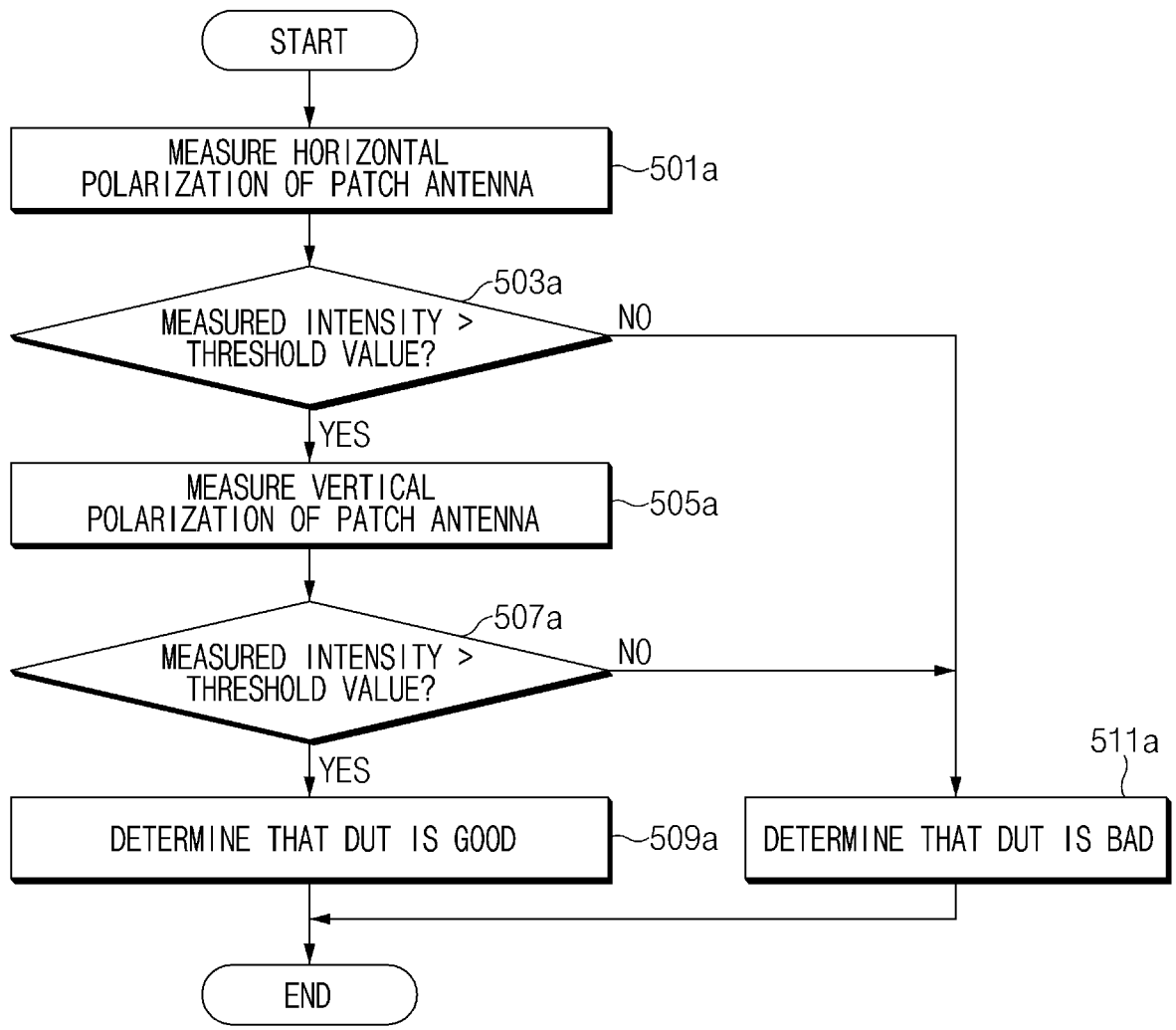
FIG. 5*a* is a flowchart illustrating a method of verifying a polarization characteristic by an antenna chamber, according to an embodiment.

FIG. 5a is a flowchart illustrating a method of checking a polarization characteristic by an antenna chamber, according to an embodiment.

Referring to FIG. 5a, the method of checking the polarization characteristic of the antenna chamber may include operations 501a to 511a. According to various embodiments, operations 501a to 511a may be understood as being performed by the antenna chamber 100 (or the control circuit 150) illustrated in FIG. 2 or the antenna chamber 300 (or the control circuit 150) illustrated in FIG. 3. According to various embodiments, the method of checking the polarization characteristic of the antenna chamber is not limited to the order illustrated in FIG. 5a. For example, differently from that illustrated in FIG. 5a, operations 505a to 507a may be performed prior to operations 501a to 505a.

In operation 501a, the antenna chamber 100 or 300 may measure the horizontal polarization of the patch antenna included in the DUT 101 (e.g., the DUT 101 of FIG. 1). For example, the control circuit 150 may control a signal generator (e.g., the signal generator 130 of FIG. 2) such that the horizontally polarized signal is transmitted to the patch antenna of the DUT 101. The control circuit 150 may control the DUT 101 such that the DUT 101 emits the horizontally polarized signal transmitted from the signal generator in at least one direction. For example, the control circuit 150 may control a PS electrically connected to each of the plurality of patch antennas, and may control the DUT 101 such that the plurality of patch antennas form a beam in at least one direction. The horizontally polarized signal emitted from the DUT 101 may be measured by a signal meter (e.g., the signal meter 140 of FIG. 2) through at least one antenna (e.g., the antenna 120 of FIG. 2).

According to various embodiments, the horizontally polarized signal may be measured by the signal meter through a single antenna or a plurality of antennas based on the emitted direction. For example, referring to FIG. 1, if the horizontally polarized signal is emitted in the first direction 11, the signal meter may measure the horizontally polarized signal by using the first antenna. For another example, referring to FIG. 1, if the horizontally polarized signal is emitted in the second-first direction 12-1, the signal meter may measure the horizontally polarized signal by using the first antenna and/or the second antenna.

In operation 503a, the control circuit 150 may check whether the intensity of the horizontally polarized signal measured in operation 501a is greater than a threshold value. The control circuit 150 may perform operation 505a if the measured intensity of the horizontally polarized signal is greater than a threshold value, and may perform operation 511a if the measured intensity of the horizontally polarized signal is less than the threshold value.

According to an embodiment, the threshold value may be stored in the memory. According to various embodiments, the threshold value may be different based on a direction in which the DUT 101 emits the horizontally polarized signal. For example, when the horizontally polarized signal is emitted in the first direction 11, the intensity of the horizontally polarized signal measured through an antenna may be relatively high and the threshold value stored in the memory may be relatively high, compared to when the horizontally polarized signal is emitted in the second-first direction 12-1. For example, when the horizontally polarized signal is emitted in the first direction 11, the threshold value may be approximately 3 dB higher than when the horizontally polarized signal is emitted in the second-first direction 12-1.

In operation 505a, the antenna chamber 100 or 300 may measure the vertical polarization of the patch antenna included in the DUT 101. For example, the control circuit 150 may control the signal generator such that the vertically polarized signal is transmitted to the patch antenna of the DUT 101. The control circuit 150 may control the DUT 101 such that the DUT 101 emits the vertically polarized signal transmitted from the signal generator in at least one direction. For example, the control circuit 150 may control a PS electrically connected to each of the plurality of patch antennas, and may control the DUT 101 such that the plurality of patch antennas form a beam in at least one direction. The vertically polarized signal emitted from the DUT 101 may be measured by the signal meter through at least one antenna.

According to various embodiments, the vertically polarized signal may be measured by the signal meter through a single antenna or a plurality of antennas based on the emitted direction. Description of the vertically polarized signal may be the same as or similar to the description of the horizontally polarized signal in operation 501a.

In operation 507a, the control circuit 150 may check whether the intensity of the vertically polarized signal measured in operation 505a is greater than a threshold value. The control circuit 150 may perform operation 507a if the measured intensity of the vertically polarized signal is greater than a threshold value, and may perform operation 511a if the measured intensity of the horizontally polarized signal is less than the threshold value. The description of the threshold value may be the same as or similar to the description of operation 503a.

In operation 509a, the control circuit 150 may determine that the polarization characteristic for the patch antenna of the DUT 101 is equal to or greater than a specified level, and may determine that the DUT 101 is good.

In operation 511a, the control circuit 150 may determine that at least one of the polarization characteristics for the patch antenna of the DUT 101, for example, a horizontal polarization characteristic or a vertical polarization characteristic, is less than a specified level, and may determine that the DUT 101 is bad.

Figure 5B:
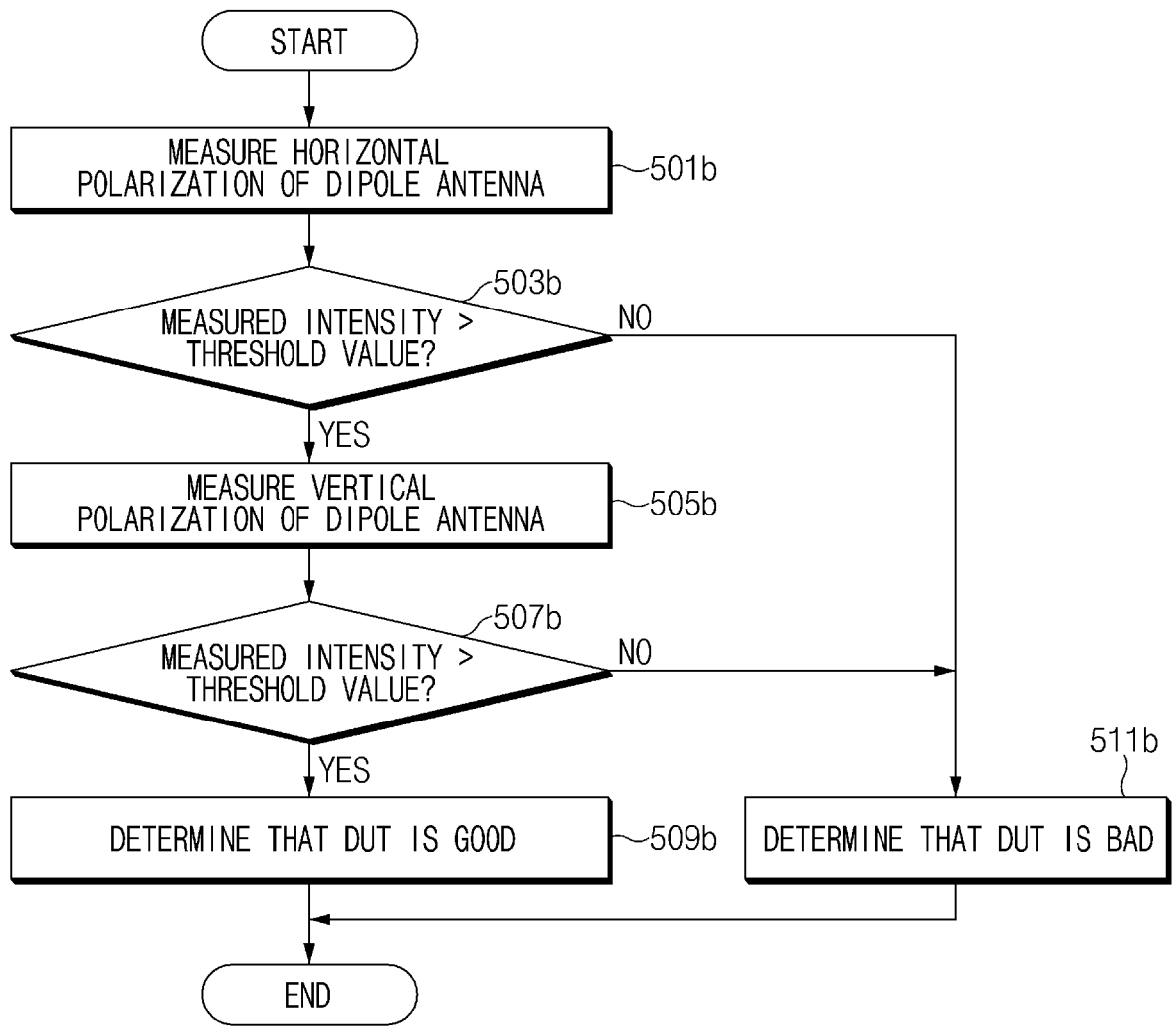
FIG. 5*b* is a flowchart illustrating a method of verifying a polarization characteristic by an antenna chamber, according to another embodiment.

FIG. 5b is a flowchart illustrating a method of checking a polarization characteristic by an antenna chamber, according to another embodiment.

Referring to FIG. 5b, the method of checking the polarization characteristic of the antenna chamber may include operations 501b to 511b. According to various embodiments, operations 501b to 511b may be understood as being performed by the antenna chamber 100 (or the control circuit 150) illustrated in FIG. 2 or the antenna chamber 300 (or the control circuit 150) illustrated in FIG. 3. According to various embodiments, the method of checking the polarization characteristic of the antenna chamber is not limited to the order illustrated in FIG. 5b. For example, differently from that illustrated in FIG. 5b, operations 505b to 507b may be performed prior to operations 501b to 505b.

According to various embodiments, operations 501b to 507b may correspond to operations 501a to 507a shown in FIG. 5a, respectively. For example, in operation 501b or operation 505b, the control circuit 150 may control a signal generator (e.g., the signal generator 130 in FIG. 2) such that a specified signal is transmitted to the dipole antenna, instead of the patch antenna, of the DUT 101 (e.g., the DUT 101 of FIG. 1). For another example, in operation 501b or operation 505b, the control circuit 150 may control the DUT 101 such that a plurality of dipole antennas, instead of a plurality of patch antennas, of the DUT 101 form a beam in a specified direction. Accordingly, the description of operations 501b to 507b may be understood as being the same as or similar to the description of operations 501a to 507a illustrated in FIG. 5a.

In operation 509b, the control circuit 150 may determine that the polarization characteristic for the dipole antenna of the DUT 101 is equal to or greater than a specified level, and may determine that the DUT 101 is good.

In operation 511b, the control circuit 150 may determine that at least one of the polarization characteristics for the dipole antenna of the DUT 101, for example, a horizontal polarization characteristic or a vertical polarization characteristic, is less than a specified level, and may determine that the DUT 101 is bad.

Figure 6:
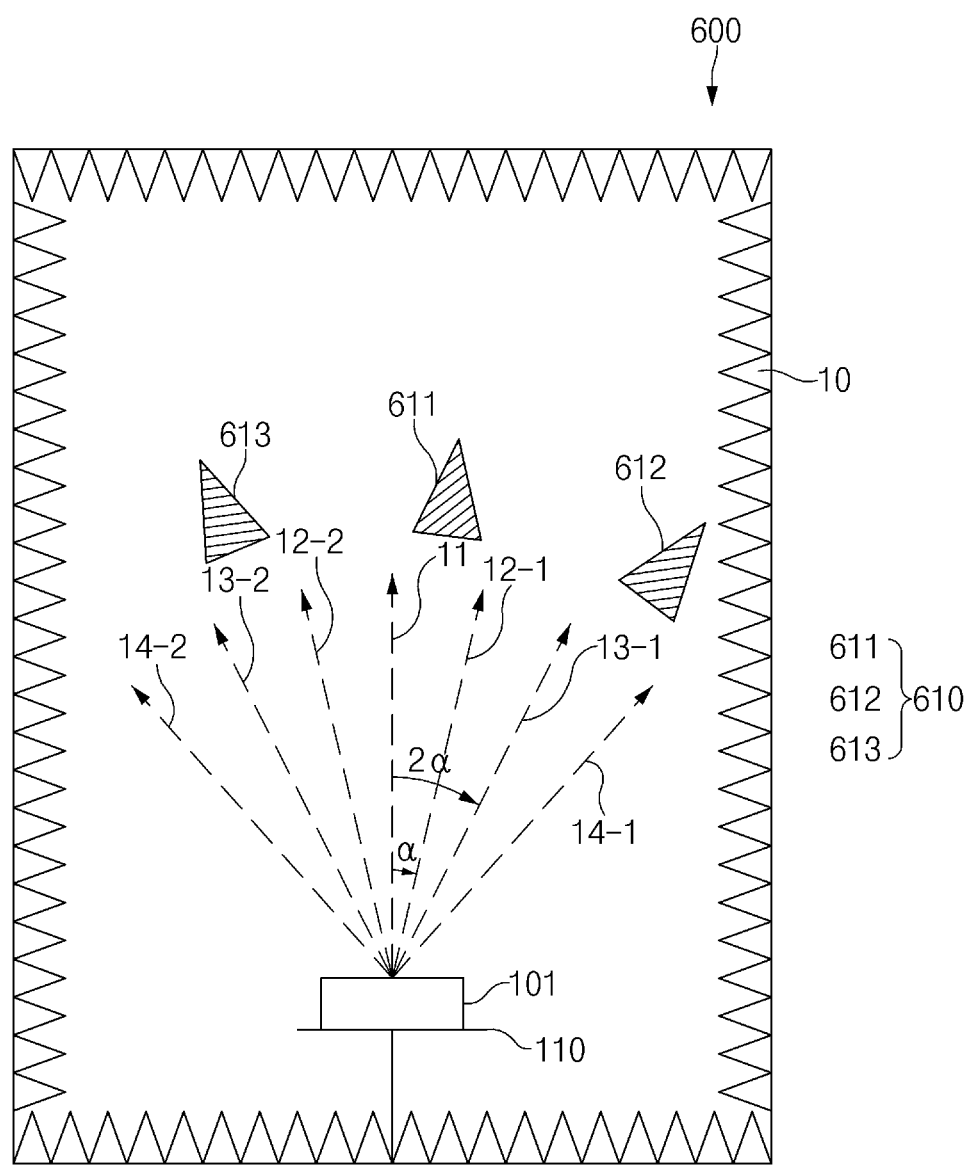
FIG. 6 is a diagram illustrating an antenna chamber according to yet another embodiment.

FIG. 6 is a diagram illustrating an antenna chamber 600 according to yet another embodiment.

Referring to FIG. 6, the antenna chamber 600 may include the mounting unit 110 on which the device under test (DUT) 101 is mounted and a plurality of antennas 610. The description of the DUT 101, the mounting unit 110, and the wall surface 10 illustrated in FIG. 1 may also be applied to the antenna chamber 600 illustrated in FIG. 6.

According to an embodiment, the plurality of antennas 610 may include, for example, a first antenna 611, a second antenna 612, and a third antenna 613. According to various embodiments, the plurality of antennas 610 are not limited to those illustrated in FIG. 6. For example, the plurality of antennas 610 may further include a fourth antenna, or at least one of the antennas illustrated in FIG. 6 may be omitted.

According to an embodiment, the plurality of antennas 610 may be disposed at positions corresponding to directions specified from the DUT 101. For example, the plurality of antennas 610 may be disposed at positions spaced apart from the DUT 101 by a specified distance and between two beams formed by the DUT 101. According to an embodiment, the first antenna 611 may be disposed at a position spaced apart from the DUT 101 by a specified distance and between the first direction 11 and the second-first direction 12-1.

According to an embodiment, the plurality of antennas 610 may be disposed at positions corresponding to the directions rotated by a specified angle as a unit, for example, the second angle $2\alpha$, with respect to the direction between the first direction 11 and the second-first direction 12-1, from the DUT 101. For example, the second antenna 612 may be disposed at a position spaced apart from the DUT 101 by a specified distance and corresponding to the direction rotated clockwise from between the first direction 11 and the second-first direction 12-1 by the second angle $2\alpha$, for example, between the third-first direction 13-1 and the fourth-first direction 14-1, as illustrated in FIG. 6. For another example, the third antenna 613 may be disposed at a position spaced apart from the DUT 101 by a specified distance and corresponding to the direction rotated counterclockwise from between the first direction 11 and the second-first direction 12-1 by the second angle $2\alpha$, for example, between the second-second direction 12-2 and the third-second direction 13-2, as illustrated in FIG. 6.

According to various embodiments, the second angle $2\alpha$ is not limited to that illustrated in FIG. 6. For example, in FIG. 6, the second angle is illustrated to be twice the first angle, but the second angle may be three times or four times the first angle.

In an embodiment, if the DUT 101 accurately directs and emits the millimeter-wave signal in the set direction, the intensity of the millimeter-wave signal detected by the plurality of antennas 610 may be equal to or higher than a specified level. In this case, a determination may be made that the beamforming performance of the DUT 101 is equal to or higher than a specified level. In another embodiment, if the DUT 101 emits the millimeter-wave signal in a direction different from the set direction, the intensity of the millimeter-wave signal detected by the plurality of antennas 610 may be lower than the specified level. In this case, a determination may be made that the beamforming performance of the DUT 101 is less than the specified level.

An antenna chamber according to an embodiment of the present disclosure may include a signal generator, a mounting unit in which a device under test (DUT) is disposed, the DUT being electrically connected to the signal generator to form a beam toward a first direction and directions rotated by a first angle based on the first direction, a plurality of antennas disposed at a position corresponding to the first direction from the DUT and positions corresponding to directions rotated by twice the first angle from the DUT based on the first direction and receiving a signal emitted from the DUT, a signal meter configured to measure an intensity of a signal received from at least one of the plurality of antennas, and a control circuit electrically connected to the DUT, the signal generator, and the signal meter, and the control circuit may be configured to control the signal generator to generate a specified signal and transmit the specified signal to the DUT, control the DUT to form a beam in any one direction of the first direction and the directions rotated by the first angle based on the first direction and emit the specified signal by using the formed beam, and check an antenna performance of the DUT based on at least the intensity measured from the signal meter.

According to an embodiment of the present disclosure, the control circuit may determine that the antenna performance of the DUT is equal to or greater than a specified level if the measured intensity is equal to or greater than a threshold value.

According to an embodiment of the present disclosure, the threshold value may correspond to a first threshold value if any one of the plurality of antennas is disposed at a position corresponding to the any one direction from the DUT, the threshold value may correspond to a second threshold value if any one of the plurality of antennas is not disposed at the position corresponding to the any one direction from the DUT, and the second threshold value may be smaller than the first threshold value by the specified level.

According to an embodiment of the present disclosure, the antenna chamber may further include a memory, and the control circuit may be configured to store information on the specified signal generated by the signal generator in the memory and check the antenna performance of the DUT based on the intensity measured from the signal meter and the information stored in the memory.

According to an embodiment of the present disclosure, the information stored in the memory may include at least one of an intensity, a direction, and a polarization characteristic of the specified signal.

According to an embodiment of the present disclosure, the control circuit may be configured to control the DUT to sequentially form a beam toward the first direction and the directions rotated by the first angle based on the first direction at a specified time interval and emit the specified signal by using the sequentially formed beam, and check the antenna performance of the DUT based on at least an intensity sequentially measured from the signal meter.

According to an embodiment of the present disclosure, the specified signal may include a vertical polarization characteristic or a horizontal polarization characteristic, the plurality of antennas may be capable of detecting the horizontal polarization characteristic and the vertical polarization characteristic, and the control circuit may be configured to check the antenna performance of the DUT according to each polarization characteristic of the specified signal.

According to an embodiment of the present disclosure, the plurality of antennas may be circular horn antennas.

According to an embodiment of the present disclosure, the DUT may include an antenna module, and the antenna chamber may further include a power supply configured to supply power to the antenna module.

According to an embodiment of the present disclosure, the antenna chamber may further include a first switch in which one of both ends is connected to the plurality of antennas and a second switch selectively connecting the first switch to the signal meter and selectively connecting the DUT to the signal generator.

According to an embodiment of the present disclosure, the DUT may include a patch antenna array.

According to an embodiment of the present disclosure, the DUT may include a dipole antenna array.

A method according to an embodiment of the present disclosure may be a method of checking an antenna performance of a DUT capable of forming a beam toward a first direction and directions rotated by a first angle based on the first direction, the method including generating a specified signal to transmit the specified signal to the DUT, controlling the DUT to form a beam in any one direction of the first direction and the directions rotated by the first angle based on the first direction and emit the specified signal by using the formed beam, receiving a signal emitted from the DUT through a plurality of antennas disposed at a position corresponding to the first direction from the DUT and positions corresponding to directions rotated by twice the first angle from the DUT based on the first direction, and measuring an intensity of the received signal, and checking an antenna performance of the DUT based on at least the measured intensity.

According to an embodiment of the present disclosure, the method may further include determining that the antenna performance of the DUT is equal to or greater than a specified level if the measured intensity is equal to or greater than a threshold value.

According to an embodiment of the present disclosure, the method may further include storing information on the specified signal in a memory, and the checking of the antenna performance of the DUT may include checking the antenna performance of the DUT based on the measured intensity and the information stored in the memory.

An antenna module according to an embodiment of the present disclosure may include a signal generator configured to generate a specified signal, a control circuit configured to control an external antenna module capable of forming a beam in a first direction, a second direction that forms a first angle with respect to the first direction, or a third direction that forms the first angle with respect to the second direction and is different from the first direction on a plane including the first direction and the second direction such that the external antenna module forms the beam and emits the specified signal, a first antenna disposed between the first direction and the second direction and capable of measuring vertical polarization and horizontal polarization, a second antenna disposed between the second direction and the third direction and capable of measuring the vertical polarization and the horizontal polarization, and a signal meter configured to measure a magnitude of the specified signal received through the first antenna and the second antenna.

According to an embodiment of the present disclosure, the control circuit may be configured to determine that the antenna performance of the external antenna module is equal to or greater than a specified level if the measured magnitude is equal to or greater than a threshold value.

According to an embodiment of the present disclosure, the threshold value may correspond to a first threshold value if the external antenna module emits the specified signal in the first direction or the third direction, the threshold value may correspond to a second threshold value if the external antenna module emits the specified signal in the second direction, and the second threshold value may be smaller than the first threshold value by the specified level.

The antenna module according to an embodiment of the present invention may further include a memory, and the control circuit may be configured to store information on the specified signal generated by the signal generator in the memory, and verify the antenna performance of the external antenna module based on the intensity measured by the signal meter and the information stored in the memory.

According to an embodiment of the present disclosure, the information stored in the memory may include at least one of an intensity, a direction, and a polarization characteristic of the specified signal.

Figure 7:
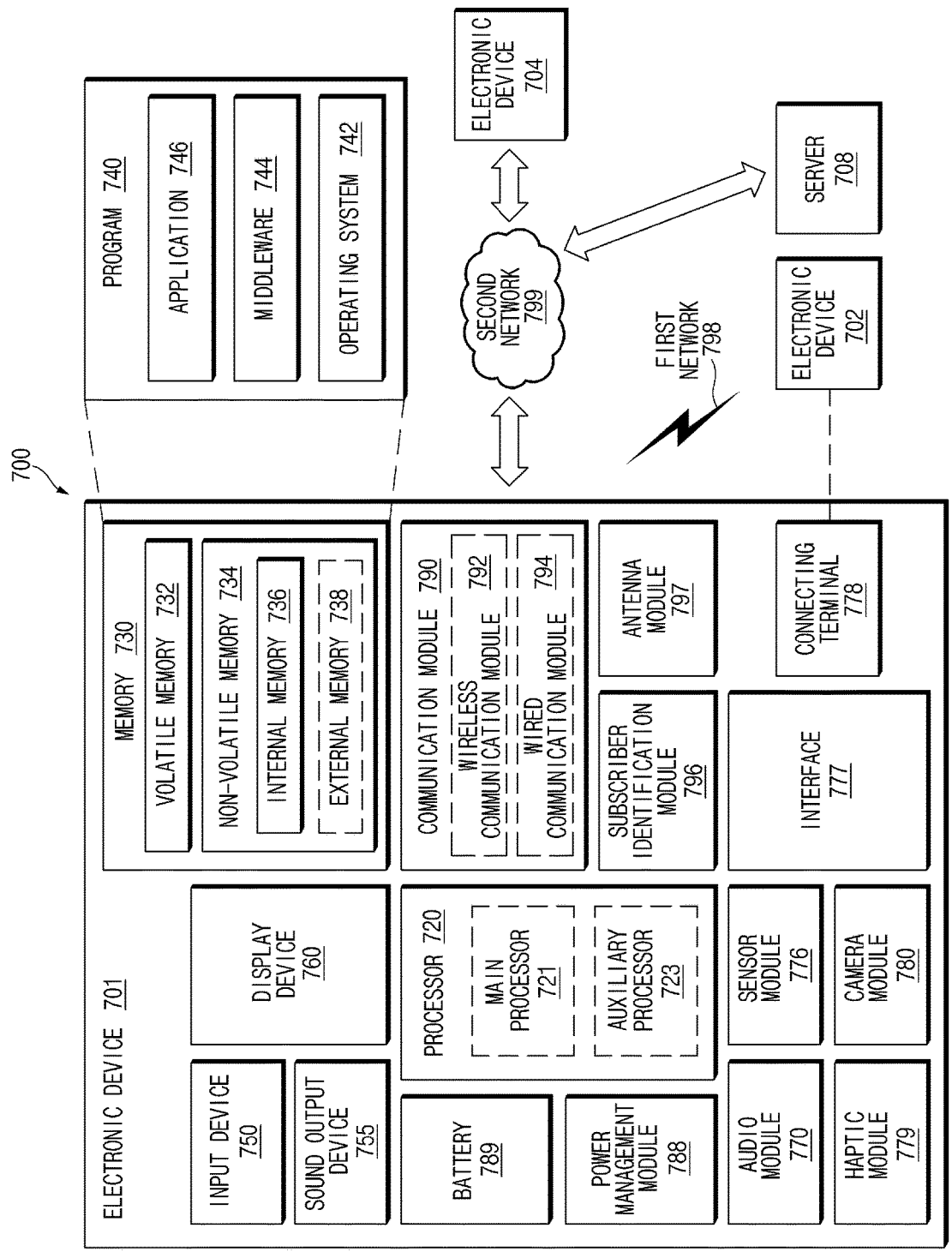
FIG. 7 is a block diagram illustrating an electronic device in a network environment according to various embodiments.

FIG. 7 is a block diagram illustrating an electronic device 701 in a network environment 700 according to various embodiments.

Referring to FIG. 7, the electronic device 701 in the network environment 700 may communicate with an electronic device 702 via a first network 798 (e.g., a short-range wireless communication network), or an electronic device 704 or a server 708 via a second network 799 (e.g., a long-range wireless communication network). According to an embodiment, the electronic device 701 may communicate with the electronic device 704 via the server 708. According to an embodiment, the electronic device 701 may include a processor 720, memory 730, an input device 750, a sound output device 755, a display device 760, an audio module 770, a sensor module 776, an interface 777, a haptic module 779, a camera module 780, a power management module 788, a battery 789, a communication module 790, a subscriber identification module (SIM) 796, or an antenna module 797. In some embodiments, at least one (e.g., the display device 760 or the camera module 780) of the components may be omitted from the electronic device 701, or one or more other components may be added in the electronic device 701. In some embodiments, some of the components may be implemented as single integrated circuitry. For example, the sensor module 776 (e.g., a fingerprint sensor, an iris sensor, or an illuminance sensor) may be implemented as embedded in the display device 760 (e.g., a display).

The processor 720 may execute, for example, software (e.g., a program 740) to control at least one other component (e.g., a hardware or software component) of the electronic device 701 coupled with the processor 720, and may perform various data processing or computation. According to one embodiment, as at least part of the data processing or computation, the processor 720 may load a command or data received from another component (e.g., the sensor module 776 or the communication module 790) in volatile memory 732, process the command or the data stored in the volatile memory 732, and store resulting data in non-volatile memory 734. According to an embodiment, the processor 720 may include a main processor 721 (e.g., a central processing unit (CPU) or an application processor (AP)), and an auxiliary processor 723 (e.g., a graphics processing unit (GPU), an image signal processor (ISP), a sensor hub processor, or a communication processor (CP)) that is operable independently from, or in conjunction with, the main processor 721. Additionally or alternatively, the auxiliary processor 723 may be adapted to consume less power than the main processor 721, or to be specific to a specified function. The auxiliary processor 723 may be implemented as separate from, or as part of the main processor 721.

The auxiliary processor 723 may control at least some of functions or states related to at least one component (e.g., the display device 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). According to an embodiment, the auxiliary processor 723 (e.g., an image signal processor or a communication processor) may be implemented as part of another component (e.g., the camera module 780 or the communication module 790) functionally related to the auxiliary processor 723.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input device 750 may receive a command or data to be used by other component (e.g., the processor 720) of the electronic device 701, from the outside (e.g., a user) of the electronic device 701. The input device 750 may include, for example, a microphone, a mouse, a keyboard, or a digital pen (e.g., a stylus pen).

The sound output device 755 may output sound signals to the outside of the electronic device 701. The sound output device 755 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 760 may visually provide information to the outside (e.g., a user) of the electronic device 701. The display device 760 may include, for example, a display, a hologram device, or a projector and control circuitry to control a corresponding one of the display, hologram device, and projector. According to an embodiment, the display device 760 may include touch circuitry adapted to detect a touch, or sensor circuitry (e.g., a pressure sensor) adapted to measure the intensity of force incurred by the touch.

The audio module 770 may convert a sound into an electrical signal and vice versa. According to an embodiment, the audio module 770 may obtain the sound via the input device 750, or output the sound via the sound output device 755 or a headphone of an external electronic device (e.g., an electronic device 702) directly (e.g., wiredly) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. According to an embodiment, the sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled with the external electronic device (e.g., the electronic device 702) directly (e.g., wiredly) or wirelessly. According to an embodiment, the interface 777 may include, for example, a high definition multimedia interface (HDMI), a universal serial bus (USB) interface, a secure digital (SD) card interface, or an audio interface.

A connecting terminal 778 may include a connector via which the electronic device 701 may be physically connected with the external electronic device (e.g., the electronic device 702). According to an embodiment, the connecting terminal 778 may include, for example, a HDMI connector, a USB connector, a SD card connector, or an audio connector (e.g., a headphone connector).

The haptic module 779 may convert an electrical signal into a mechanical stimulus (e.g., a vibration or a movement) or electrical stimulus which may be recognized by a user via his tactile sensation or kinesthetic sensation. According to an embodiment, the haptic module 779 may include, for example, a motor, a piezoelectric element, or an electric stimulator.

The camera module 780 may capture a still image or moving images. According to an embodiment, the camera module 780 may include one or more lenses, image sensors, image signal processors, or flashes.

The power management module 788 may manage power supplied to the electronic device 701. According to one embodiment, the power management module 788 may be implemented as at least part of, for example, a power management integrated circuit (PMIC).

The battery 789 may supply power to at least one component of the electronic device 701. According to an embodiment, the battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the application processor (AP)) and supports a direct (e.g., wired) communication or a wireless communication. According to an embodiment, the communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct, or infrared data association (IrDA)) or the second network 799 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The antenna module 797 may transmit or receive a signal or power to or from the outside (e.g., the external electronic device) of the electronic device 701. According to an embodiment, the antenna module 797 may include an antenna including a radiating element composed of a conductive material or a conductive pattern formed in or on a substrate (e.g., PCB). According to an embodiment, the antenna module 797 may include a plurality of antennas. In such a case, at least one antenna appropriate for a communication scheme used in the communication network, such as the first network 798 or the second network 799, may be selected, for example, by the communication module 790 (e.g., the wireless communication module 792) from the plurality of antennas. The signal or the power may then be transmitted or received between the communication module 790 and the external electronic device via the selected at least one antenna. According to an embodiment, another component (e.g., a radio frequency integrated circuit (RFIC)) other than the radiating element may be additionally formed as part of the antenna module 797.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 701 and the external electronic device 704 via the server 708 coupled with the second network 799. Each of the electronic devices 702 and 704 may be a device of a same type as, or a different type, from the electronic device 701. According to an embodiment, all or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 740) including one or more instructions that are stored in a storage medium (e.g., internal memory 736 or external memory 738) that is readable by a machine (e.g., the electronic device 701). For example, a processor (e.g., the processor 720) of the machine (e.g., the electronic device 701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
a signal generator;
a mounting unit on which a device under test (DUT) is disposed, the DUT being electrically connected to the signal generator to form a beam toward a first direction and directions rotated by a first angle based on the first direction;
a plurality of antennas disposed at a position corresponding to the first direction from the DUT and positions corresponding to directions rotated by twice the first angle from the DUT based on the first direction and receiving a signal emitted from the DUT;
a signal meter configured to measure an intensity of a signal received from at least one of the plurality of antennas; and
a control circuit electrically connected to the DUT, the signal generator, and the signal meter,
wherein the control circuit is configured to:
control the signal generator to generate a specified signal and transmit the specified signal to the DUT;
control the DUT to form a beam in any one direction of the first direction and the directions rotated by the first angle based on the first direction and emit the specified signal by using the formed beam; and
check an antenna performance of the DUT based on at least the intensity measured from the signal meter.

2. The electronic device of claim 1, wherein the control circuit determines that the antenna performance of the DUT is equal to or greater than a specified level if the measured intensity is equal to or greater than a threshold value.

3. The electronic device of claim 2, wherein the threshold value corresponds to a first threshold value if any one of the plurality of antennas is disposed at a position corresponding to the any one direction from the DUT,
the threshold value corresponds to a second threshold value if any one of the plurality of antennas is not disposed at the position corresponding to the any one direction from the DUT, and
the second threshold value is smaller than the first threshold value by the specified level.

4. The electronic device of claim 1, further comprising a memory,
wherein the control circuit is configured to:
store information on the specified signal generated by the signal generator in the memory; and
check the antenna performance of the DUT based on the intensity measured from the signal meter and the information stored in the memory.

5. The electronic device of claim 4, wherein the information stored in the memory includes at least one of an intensity, a direction, and a polarization characteristic of the specified signal.

6. The electronic device of claim 1, wherein the control circuit is configured to:
control the DUT to sequentially form a beam toward the first direction and the directions rotated by the first angle based on the first direction at a specified time interval and emit the specified signal by using the sequentially formed beam; and
check the antenna performance of the DUT based on at least an intensity sequentially measured from the signal meter.

7. The electronic device of claim 1, wherein the specified signal includes a vertical polarization characteristic or a horizontal polarization characteristic,
the plurality of antennas are capable of detecting the horizontal polarization characteristic and the vertical polarization characteristic, and
the control circuit is configured to check the antenna performance of the DUT according to each polarization characteristic of the specified signal.

8. The electronic device of claim 1, wherein the plurality of antennas are circular horn antennas.

9. The electronic device of claim 1, wherein the DUT includes an antenna module, and
the electronic device further comprises a power supply configured to supply power to the antenna module.

10. The electronic device of claim 1, further comprising:
a first switch in which one of both ends is connected to the plurality of antennas; and
a second switch selectively connecting the first switch to the signal meter and selectively connecting the DUT to the signal generator.

11. The electronic device of claim 1, further comprising wherein the DUT includes a patch antenna array.

12. The electronic device of claim 1, wherein the DUT includes a dipole antenna array.

13. A method of checking an antenna performance of a DUT capable of forming a beam toward a first direction and directions rotated by a first angle based on the first direction, the method comprising:
generating a specified signal to transmit the specified signal to the DUT;
controlling the DUT to form a beam in any one direction of the first direction and the directions rotated by the first angle based on the first direction and emit the specified signal by using the formed beam;
receiving a signal emitted from the DUT through a plurality of antennas disposed at a position corresponding to the first direction from the DUT and positions corresponding to directions rotated by twice the first angle from the DUT based on the first direction; and
measuring an intensity of the received signal; and
checking an antenna performance of the DUT based on at least the measured intensity.

14. The method of claim 13, further comprising determining that the antenna performance of the DUT is equal to or greater than a specified level if the measured intensity is equal to or greater than a threshold value.

15. The method of claim 13, further comprising storing information on the specified signal in a memory,
wherein the checking of the antenna performance of the DUT includes checking the antenna performance of the DUT based on the measured intensity and the information stored in the memory.

* * * * *